United States Patent [19]

Haulin

[11] Patent Number: 5,498,972
[45] Date of Patent: Mar. 12, 1996

[54] DEVICE FOR MONITORING THE SUPPLY VOLTAGE ON INTEGRATED CIRCUITS

[75] Inventor: Tord Haulin, Uppsala, Sweden

[73] Assignee: Telefonaktiebolaget LM Ericsson, Stockholm, Sweden

[21] Appl. No.: 185,145

[22] Filed: Jan. 24, 1994

Related U.S. Application Data

[63] Continuation-in-part of Ser. No. 745,411, Aug. 15, 1991, abandoned.

[30] Foreign Application Priority Data

Aug. 15, 1990 [SE] Sweden .................................. 9002665

[51] Int. Cl.$^6$ .......................... G01R 31/28; G01R 19/04; G01R 31/40
[52] U.S. Cl. ...................... 324/765; 324/103 P; 324/771; 324/763; 371/22.3
[58] Field of Search .............................. 324/158.1, 765, 324/771, 103 P, 763; 371/22.3, 22.5, 22.6; 257/48

[56] References Cited

U.S. PATENT DOCUMENTS

| | | | |
|---|---|---|---|
| 3,859,638 | 1/1975 | Hume, Jr. ................................. | 340/173 |
| 4,197,582 | 4/1980 | Johnston et al. ........................ | 364/483 |
| 4,288,865 | 9/1981 | Graham .................................... | 365/229 |
| 4,384,350 | 5/1983 | Lee et al. ................................. | 365/229 |
| 4,467,275 | 8/1984 | Maeda et al. ............................ | 324/765 |
| 4,528,505 | 7/1985 | Peterson .................................. | 324/765 |
| 4,841,232 | 6/1989 | Graham et al. .............................. | 371/6 |
| 4,860,288 | 8/1989 | Teske et al. ................................. | 371/1 |
| 4,872,169 | 10/1989 | Whetsel, Jr. ............................ | 371/22.3 |
| 4,875,003 | 10/1989 | Burke ...................................... | 324/73 R |
| 4,879,717 | 11/1989 | Sauerwald et al. ..................... | 371/22.3 |
| 4,910,455 | 3/1990 | Nadd ....................................... | 324/123 R |
| 4,963,824 | 10/1990 | Hsieh et al. ............................ | 324/158 R |
| 4,999,575 | 3/1991 | Germer ................................... | 324/142 |
| 5,057,774 | 10/1991 | Verhelst et al. ........................ | 324/158 R |
| 5,063,304 | 11/1991 | Iyengar .................................. | 307/296.6 |
| 5,122,920 | 6/1992 | Pease ........................................ | 361/92 |
| 5,285,151 | 2/1994 | Akama et al. .......................... | 324/765 |

FOREIGN PATENT DOCUMENTS 358376  3/1990  European Pat. Off. .

OTHER PUBLICATIONS

"Strategies for Testing VLSI Boards Using *Boundary Scan*", P. Hansen, *Electronic Engineering*, vol. 61, No. 755, pp. 103, 105–106, 109; 111, Nov. 1989.

"*Dividing Up a PC Board With Boundary Scan Extends Chip–Oriented, Design–For–Testability Systems to PC Boards*", Bottom–Up Techniques Propel Board Testability, Ellis et al., *Electronic Design*, vol. 38, No. 10, pp. 57–60, 62, 64, May 24, 1990.

"*Testing Multiple Power Connections with Boundary Scan*", Dirk van de Lagemaat, *IEEE*, pp. 127–130, 1989.

"*Elimination of Bus Contention During Chip–to–Chip Connectivity Test*", *IBM Technical Disclosure Bulletin*, vol. 32, No. 6A, Nov., 1989.

"*Self Test Method for Secure LSSD Chip*", *Research Disclosure*, p. 336, May, 1989.

"*Circuit Board Tester*", *Research Disclosure*, p. 244, Apr., 1987.

*Primary Examiner*—Ernest F. Karlsen
*Attorney, Agent, or Firm*—Burns, Doane, Swecker & Mathis

[57] ABSTRACT

A device for monitoring supply voltage locally on integrated circuits after mounting on electronic component boards (11) includes at least one voltage monitor (31) as well as boundary scan means (36, 36', 37) for reading out the result of the monitoring. The monitor includes an extreme value detector (41), situated at the place on the circuit surface where voltage monitoring is desired and detecting the minimum absolute voltage between a local supply voltage lead and a local ground lead. The minimum value detector comprises one or two FET transistors at most.

23 Claims, 4 Drawing Sheets

DEVICE FOR MONITORING THE SUPPLY VOLTAGE ON INTEGRATED CIRCUITS

RELATED APPLICATION

This application is a continuation-in-part of U.S. patent application Ser. No. 07/745,411, filed on Aug. 15, 1991, now abandoned, which application is incorporated here by reference.

BACKGROUND

The present invention is related to devices and methods for monitoring the supply voltage and ground connections on an integrated circuit (IC) after mounting thereof on a circuit board, including at least one voltage monitor and means for reading out the result of monitoring.

Electronic integrated circuits of today require more and more parallel supply voltage and ground connections for maintaining sufficient supply voltage, in spite of the high transient currents typical for CMOS circuits manufactured according to the IC-technology of today. In the testing of individual circuit components there is a possibility of checking, by means of special circuit testing equipment, that each one of the voltage and ground connections is intact by the use of a fixture where the current in each power and ground lead can be measured.

This possibility does not exist for an electronic circuit board. Here all supply leads on all circuits are tied to supply nodes and individual currents cannot be measured. In addition there is the problem of checking that the decoupling capacitors included between voltage supply and ground planes have been correctly connected.

There are no particularly suitable methods today for checking the supply distribution networks when testing circuit boards if a considerable part of the supply network falls, e.g., an interruption of one of two parallel soldered connections, it is possible for a malfunction to occur when the board is tested. It can then be taken out for a (troublesome) fault finding procedure and repair. However, there is a great risk that the fault will not appear during the testing of the board, but "merely" leads to deteriorated noise margins, especially with many parallel supply pins. This will later lead to intermittent faults and a poor reliability of the system.

For the checking of supply pin connections it is already known to compare voltage at different places on a chip, e.g., between two ground pins, and read out the result via so-called boundary scanning, cf. Dirk van de Lagemaat, "Testing Multiple Power Connections with Boundary Scan", Electronic Design News, Mar. 2, 1990, pp. 127–130, which is incorporated here by reference. This technique requires considerable wiring, however, and relies on resistance differences in the board and the integrated circuit, that is in copper and aluminum, respectively. Dual sensors must be used here to guard against a break in any one of the supply pins. In addition, mean value formation and handling of small voltages are also required.

SUMMARY

In the following the means for transporting current from a power source to all circuits requiring a supply voltage, and from these circuits back to the power source, and the decoupling capacitors used for stabilizing this voltage, are referenced the supply voltage system.

The general purpose of the present invention is to ensure proper mounting and connection of circuit supply leads and the like by providing means and methods for monitoring voltage distribution systems an circuit boards using a comparatively simple and cheap device for locally monitoring supply voltages in integrated circuits after mounting thereof on a circuit board, such as to give a more distinct indication of the state of the power distribution system, and enable checking where it is really required on the circuit board by local monitoring of the directly relevant quantity, namely the instantaneous local supply voltage, inside the integrated circuits.

Another purpose of the invention is to provide devices and methods for localizing open connections such as faulty soldering joints on an electric component board.

Another purpose of the invention is to provide a simple voltage minimum value detector to be used in monitoring local supply voltages.

These purposes are achieved by devices and methods as set out in the appended claims.

By incorporating supply voltage monitoring logic at suitable places on the circuit surface the quality of the supply voltage can be checked where this it really matters during circuit board testing. Deficiencies in the voltage distribution lead to higher supply voltage ripple in the circuits. Monitoring can therefore be carried out with the add of an extreme value detector, suitably implemented as a minimum value detector. In this way possible deficiencies in the supply voltage distribution system are detected in the circuits where a malfunction can result.

Extreme value measurement is used to provide a more distinct indication. The directly relevant quantity is measured and indicated or recorded, namely the instantaneous supply voltage, as mentioned above.

Supply voltage distribution on a circuit board can thus be functionally checked with the aid of the present invention.

The added complexity of the circuit is moderate. The technique is in line with other state of the art test logic, i.e., boundary scan. Interruption in one or more of a plurality of parallel voltage supply pins, or interruption in decoupling capacitors is detected if it leads to unacceptable supply voltage ripple. The voltage supply monitors can be tested to ensure a proper functionality before a circuit is mounted on a board. This is done in the device test by temporarily lowering the supply voltage in the test equipment to the also level.

A comparator means is used to compare the voltage value sensed by the detector with a predetermined, fixed or variable voltage value. A boundary scan means can be used for reading out the result of the comparison. The reference voltage value will thus serve as an "alarm" level.

The voltage comparator means is most simply constructed as an inverter having a suitable trigger point. The decision point "alarm triggered" will be somewhat process-dependent in this case. If this is not desirable, a differential comparator can be used instead in a still further embodiment.

By placing the supply voltage monitors in the vicinity of circuit blocks having large current consumption, the lowest instantaneous supply voltage is detected.

However, for the purpose of localizing open circuit supply leads it is better to place the voltage monitors close to the voltage supply pins where the voltage is comparatively stable when soldering is correct. For large chips with many closely placed power and ground pins one supply voltage monitor per such group is sufficient.

Since pins are normally not available for real time readout of the voltage monitor output signal, the supply voltage monitors are prepared for boundary scan read out. Therefore, the monitor stores information about the monitored instantaneous supply voltage measured during a measurement interval, for subsequent scan shift readout.

BRIEF DESCRIPTION OF THE DRAWINGS

Embodiments of devices, selected as examples, for detecting unsatisfactory electric contact, in particular faulty soldering joints, on an electric or electronic circuit board will now be described in more detail and with reference to the accompanying drawings, where.

DETAILED DESCRIPTION

Figure 1:
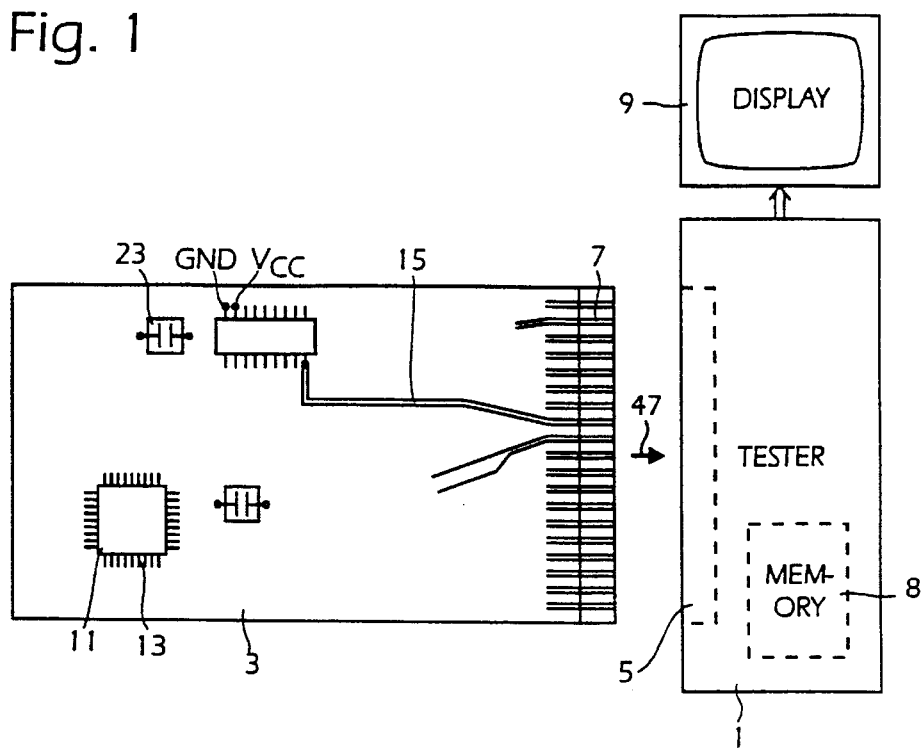
FIG. 1 is a schematic picture of a testing installation for a circuit board.

In FIG. 1 a device is illustrated for testing an electronic circuit board 3. The tester 1 comprises testing logic (not shown) and a connection socket 5 for receiving and contacting a corresponding edge connector 7 on the circuit board 3. The result of the testing operation is recorded by some recording means such as a computer hard disk memory 8 and/or indicated on a display device 9, e.g., a conventional computer monitor.

The circuit board 3 is constructed and intended to perform some information or signal processing operation in the conventional way. It comprises one or more IC-packages 11, mounted on a surface of the board and having its connecting pins 13 coupled to, usually soldered to, conducting strips or paths 15 comprised in the conductive pattern on the board, Typically the path 15 will carry some electric signals, when the board 3 is in its normal or intended operation.

Figure 2:
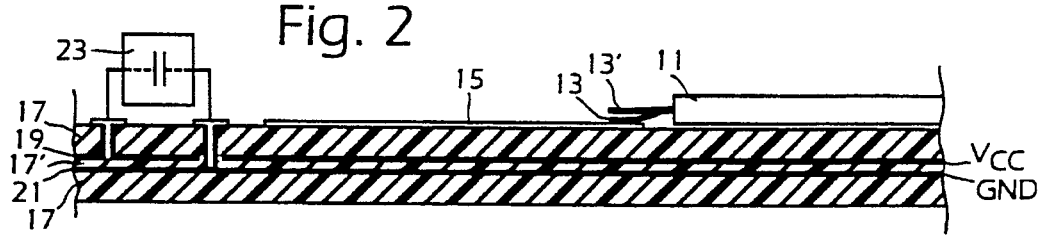
FIG. 2 is a schematic cross-sectional view of a part of a circuit board.

In FIG. 2 a fragmentary section of the circuit board 3 is illustrated. The circuit board is made from top and bottom dielectric layers 17 separated by an interior voltage supply plane 19 ($V_{cc}$) and a ground plane 21 (GND). These planes 19 and 21 can be made, e.g., of copper. They are in turn separated by an intermediate dielectric layer 17' and their mutual spacing is small in order to form a capacitor therebetween. The capacitance of this capacitor is enhanced by discrete individual component capacitors 23 mounted on the surface of the circuit board 3 and connected to the voltage supply and ground planes 19, 21.

The components 11 have some of their contact pins 13 intended to be connected to the supply voltage potential $V_{cc}$ and the ground potential GND and it is made by connection to the voltage carrying plane 19 and the ground plane 21, e.g., by means of the same kind of connection as indicated for the decoupling capacitors 23.

In operation, the electronic components on the circuit board 3 will draw current from the voltage supply plane 19, and this will be critical at high frequencies, In those cases, the capacitance of the voltage supply and ground planes 19, 21 will be helpful in providing the current required instantaneously and locally.

In FIG. 2 is also indicated that a pin 13' of the IC-package 11 has been erroneously bent upwards and thus is not in contact with and not soldered to a conductive path 15 on the pattern board 3.

Figure 3:
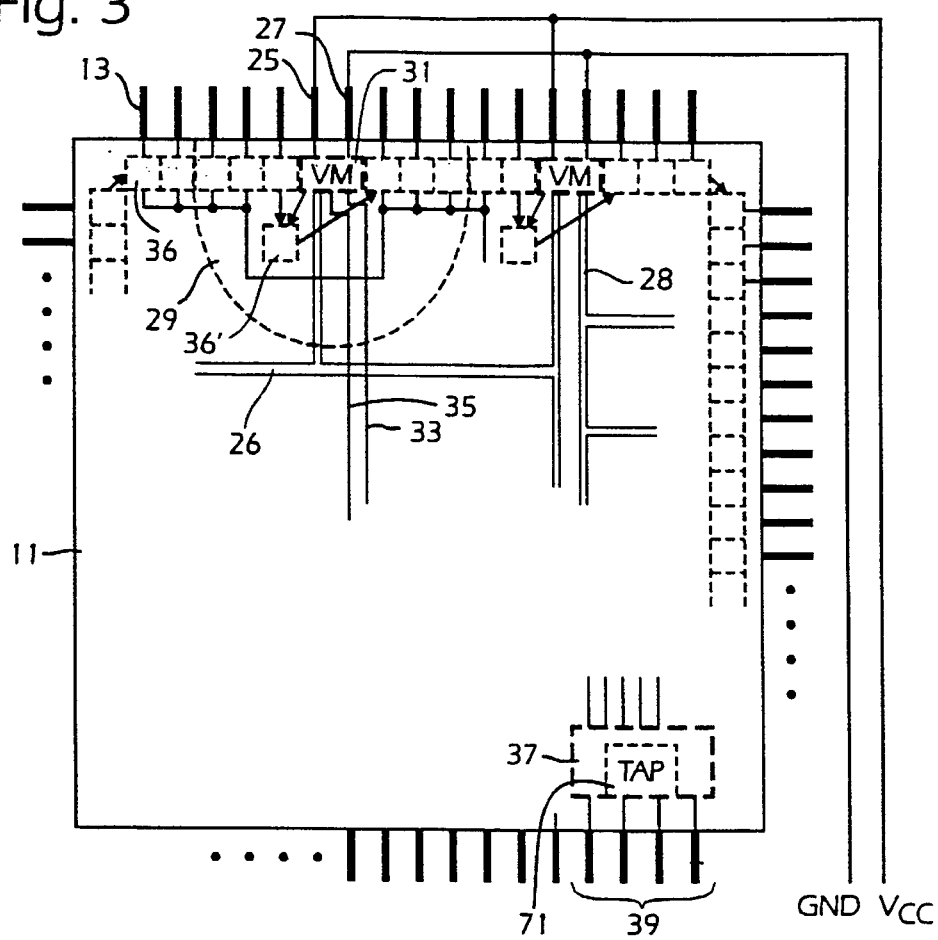
FIG. 3 is a schematic plan view of an IC-package incorporating modules for voltage monitoring.

The current supply inside an IC-package, that is in the respective IC-chip (not shown) is even more critical at high frequencies and for integrated circuits having a fairly large area. Thus, such packages are provided with multiple voltage supply pins 25 and ground connection pins 27, a voltage supply pin 25 and a ground pin 27 often being located in pairs as two adjacent pins, compare the simplified view of an electronic IC-package as illustrated in FIG. 3. Each pair of voltage supply pins 25 and ground pins 27 will then supply current primarily to a limited region of the chip, as indicated by the area inside the broken line 29 in FIG. 3. Although the power pins 25 are tied to a common power rail 26 inside the circuit and the ground pins 27 are tied to a ground rail 28, inductance and resistance in the on-chip rails limit the amount of current which can be supplied from far away pins to power consuming circuit regions of the chip. If for some reason the voltage supply is not operating correctly at a pair of voltage supply and ground pins 25, 27, the region intended to be served by these pins will tend to draw current from other supply and ground pins of the package 11 when the integrated semiconductor components inside the area defined by the broken line 29 are active and operating, they will draw current through their connecting strips inside the chip. These strips have generally a relatively poor conductance and high inductance compared to the conductive paths 15 on the pattern board 3, the former being made from aluminum or tungsten having widths of some tens of micrometers and thicknesses of about a few or less micrometers, the latter being formed from copper with a good conductivity and having thicknesses of, e.g., 35 µm. Thus voltage supply dips and peaks or spikes in the ground potential will appear locally as illustrated by the curves in the diagram of FIG. 4. There the local potentials $V_{cc}$ and GND at a place somewhere inside the chip, e.g., the region limited by the line 29, are plotted in time.

If thus the voltage supply is not operating correctly at a pair of voltage supply and ground pins 25, 27 for the package 11, the integrated circuit of the package 11 and the circuit pattern board 3 may still often be operating correctly during normal conditions, that is when, e.g., the ambient temperature is not too high, the load is normal, the input voltage from a power has a normal level, etc., but the operation of the circuits will have lower noise margins and be more sensitive to interfering effects. When the operating conditions are extreme such a board may present erroneous behavior which can be detected fairly easily but the source of which is very difficult to locate.

A similar effect can be the result when an extra enhancing capacitor 23, see FIGS. 1 and 2, is not operating satisfactorily. This will cause a voltage supply not being capable of providing enough current in all instances for high frequency operation. However, the effect thereof will be more distributed and affect the power supply quality inside nearby circuits.

To monitor the voltage supply locally, without the need of a testing equipment capable of simulating adverse ambient conditions, the integrated chip includes local voltage monitors 31, see FIG. 3. They may advantageously be located in the vicinity of the bonding pads on the chip which are arranged for the connection of the $V_{cc}$ and GND pins 25, 27 and which are connected to at least one $V_{cc}$ or GND line (not shown) on the chip. Control lines 33 connect, through corresponding conductive paths on the integrated semiconductor chip inside the package 11, the voltage monitor modules 31 to boundary scan control logic 37, also included an the chip 11 and connected to four pins 39 on the package 11, for receiving, decoding and forwarding control signals. A test result line 35 from each voltage monitor module 31 feeds test results to one cell 36' of a line of boundary scan cells 36 for shifting and communication to the tester 1. The boundary scan cells 36, 36' and control logic 37 is of the kind as described in IEEE Standard Test Access Port and Boundary Scan Architecture (JTAG standard).

Figure 5:
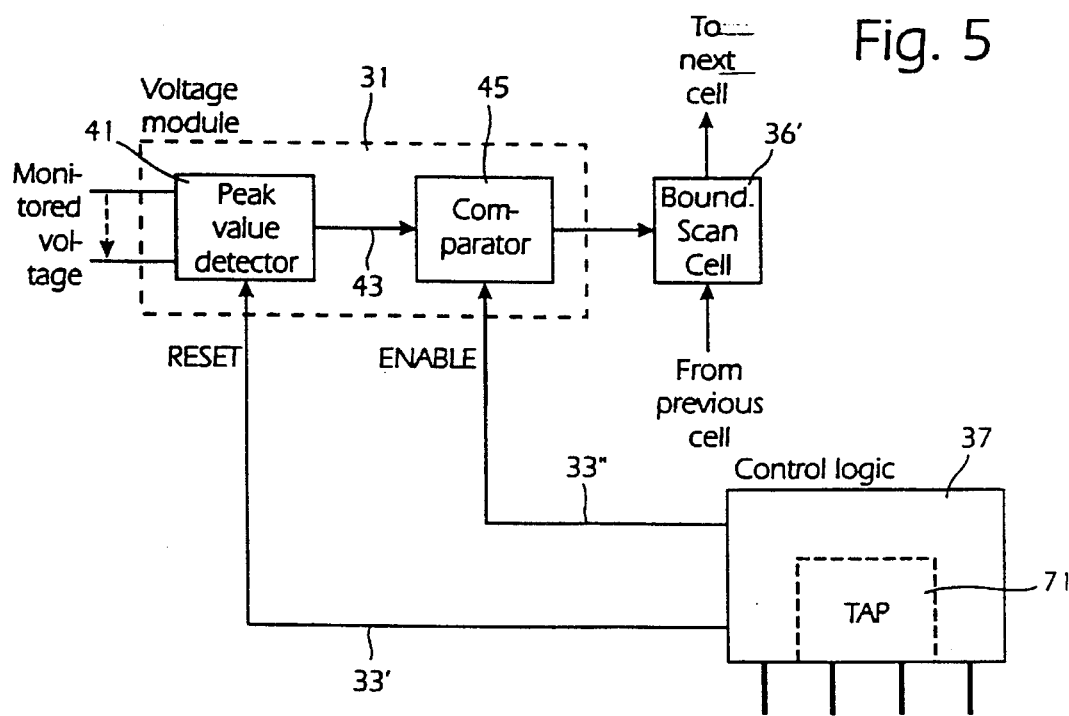
FIG. 5 is a general block diagram of a voltage module connected to boundary scan logic.

A block diagram of the voltage monitor module 31 as connected to the boundary scan circuits 36', 37 is shown in FIG. 5. The voltage monitor module 31 thus includes a peak or extreme value detector 41, which is arranged to sense and store information in respect of the minimum instantaneous supply voltage locally on the circuit surface, where the voltage monitoring is desired.

The voltage value sensed, or a signal representative thereof, is fed on a line 43 to a comparator 45 comparing the signal received to a fixed or variable reference value. The result of the comparison is, via the line 35, delivered to the boundary, scan cell 36' having read-out logic for shifting out the result in the line of cells 36 according to the boundary scan concept. Control signals "RESET" and "ENABLE" are delivered from the boundary scan control logic 37 on lines 33' and 33" respectively to the peak value detector 41 and comparator 45.

For some cases, more than one supply voltage monitor 31 react to an open circuit on one supply or ground lead 25, 27. To detect the source of the problem, the reference level of the external voltage supply can be controlled, for instance reduced from the nominal value in minute steps, as to isolate the supply voltage monitor 31 recording the lowest instantaneous minimum value, thus directing the repair operation to the leads or pins nearest to that monitor 31.

In testing the IC-package 11 on the board 3 the board is electrically connected to the tester I (insertion direction of the edge connector 7 indicated by the arrow 47 in FIG. 1) and the voltage monitor 31 is activated by first resetting the minimum value detector using the RESET signal, and then releasing the reset.

Subsequently a suitable electrical test pattern, that is a set of suitably chosen sequential electric pulses, is generated by the logic circuits (not shown) comprised in the tester 1 and fed to the IC package 11 via the conductive paths 15 on the board 3 for a time of suitable duration.

Figure 4:
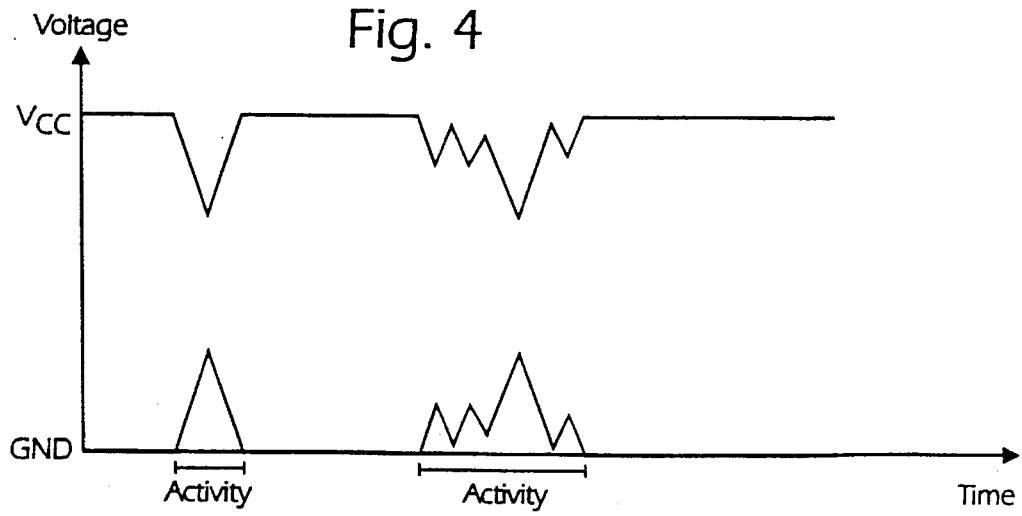
FIG. 4 is a diagram illustrating the local potentials an voltage supply and ground lines in a high-frequency integrated circuit.

During this time, the voltage monitor 31 records the lowest instantaneous value of the positive local supply voltage, that is the lowest value found in one of the dips in $V_{cc}$, compare FIG. 4, i.e., the peak or extreme value detector 41 in the voltage module 31 is implemented as a minimum value detector, as has already been mentioned. The lowest instantaneous value of the supply voltage may be more accurately defined as the lowest value, occurring during a predetermined time period, of the absolute value of the difference of the voltages on the local line carrying the supply voltage $V_{cc}$ and on the local ground line.

Figure 6A:
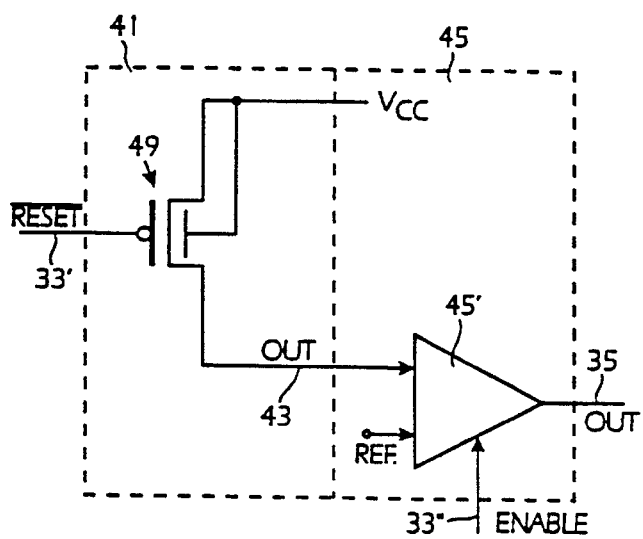
FIGS. 6a and 6b illustrate two complementary simple embodiments of an instantaneous minimum value detector comprised in the voltage module.

The minimum value detector 41 may be implemented in several ways. In FIG. 6a a very simple embodiment is illustrated, including only one p-channel FET transistor 49 connected with its source and substrate to the local line carrying the supply voltage $V_{cc}$. On the drain thereof the output signal, delivered to the line 43 is obtained. The gate of the transistor 49 is connected to the line 33' carrying the reset signal "RESET". In FIG. 6a, the comparator 45 is also illustrated as a differential amplifier receiving the signal from the peak value detector 41 on one of its input terminals and a reference voltage "REF." on the other input.

Figure 7A:
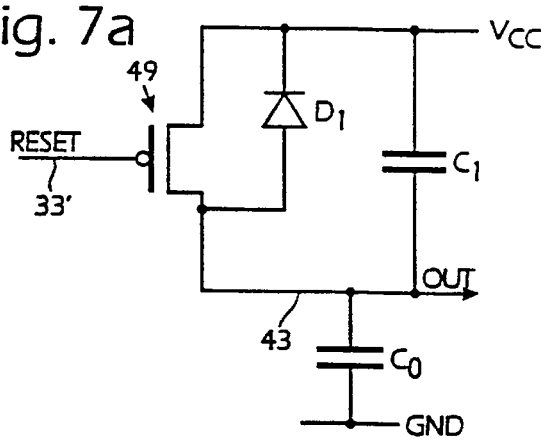
FIGS. 7a and 7b illustrate equivalent electronic circuits for the minimum value detector in the two complementary embodiments, respectively.

FIG. 7a illustrates an equivalent electric circuit for the simple minimum value detector in FIG. 6a considering in particular the parasitic elements of the actual circuit, which are shown explicitly. These parasitic elements are important to the operation of the minimum value detector and the magnitudes of their electric characteristics must be considered in the design of the circuit. Thus, the capacitance $C_1$ between the local line carrying the supply voltage $V_{cc}$ and the output connection "OUT" coupled to line 43 is here arranged, by a suitable outline of the connection lines, to be small in relation to the parasitic capacitance $C_o$ between the output connection line "OUT" and the local grounded line. The line connecting the substrate of the transistor 49 to the supply voltage line is equivalent to a diode $D_1$ connected between the drain and the supply line, the diode representing the p-n-junction between drain and substrate in the FET-transistor 49.

The circuit of FIGS. 6a and 7a operates in the following way. Before the start of the measuring period, the reset signal "RESET" on line 33' is activated. This makes the transistor 49 conductive and the output signal "OUT" from the peak value detector on line 43 assumes the voltage at the local supply line $V_{cc}$. The measurement interval begins when the reset signal is deactivated, turning the transistor 49 off. The potential $V_{out}$ at the output line "OUT" will now be dependent on the instantaneous local supply voltage $V_{cc}$ and be equal to the lowest value of the voltages obtained from the following relations:

$$V_{out} = V_{out\ reset} + (V_{out\ reset} - V_{CC}) \cdot \frac{C_1}{C_1 + C_0} \quad (1)$$

$$V_{out} = V_{cc} + V_{Dfd} \quad (2)$$

$$V_{out} = V_{cc} + V_{th} \quad (3)$$

where $V_{out\ reset}$ is the potential at the output line "OUT" when the reset signal "RESET" is applied. This makes $V_{out} = V_{cc}$. $V_{cc}$ at this time can be assumed to a value $V_{cc\ reset}$ and the circuit is operated with stopped clock signals to minimize noise. If $C_1 \ll C_o$, equation (1) gives: $V_{out} = V_{out\ reset}$.

$V_{Dfd}$ is the forward voltage drop of the equivalent diode is the $D_1$ (P-n-junction source-substrate in transistor 49) and $V_{th}$ is the threshold voltage between gate and source in the transistor 49.

If $V_{cc}$ decreases (as in one of the dips illustrated in FIG. 4). $V_{out}$ will be lowered, temporarily, if $V_{cc}$ stays within $V_{Dfd}$ or $V_{th}$ below the reset voltage $V_{out\ reset}$, and "permanently", if $V_{cc}$ decreases more.

To make the voltage monitor react to smaller dips than $V_{Dfd}$ or $V_{th}$, a higher $V_{cc}$ value can be used during the reset phase than during the measurement phase.

A decrease of $V_{cc}$ of more than $V_{Dfd}$ or $V_{th}$ below $V_{out\ reset}$ then discharges the capacitor $C_o$ through the equivalent diode $D_1$, that is through the transistor 49. When $V_{cc}$ regains its nominal voltage $V_{cc\ nom}$ the relation becomes:

$$V_{out} = V_{CC\ min} + V_{clamp} + (V_{CC\ nom} - V_{CC\ min}) \cdot \frac{C_1}{C_1 + C_0}$$

where $V_{cc\ min}$ is the minimum value of the local supply voltage $V_{cc}$. The voltage $V_{out}$ obtained at this time is thus a measure of the previously occurred voltage drop ($V_{cc\ nom} - V_{cc}$) and it-is tested in the threshold comparator 45 by activating the enable signal by a suitable command from the control logic.

In the discussion above, all voltages have been taken in relation to the local ground potential GND which also, when the component is working, may present irregularities relative to the ground potential outside the chip. Since the voltage monitor senses the minimum value of the local operating voltage on the chip, the diagnosis resolution where a faulty connection is to be expected is equal to either one (or both) of the $V_{cc}$ and ground pins near the monitor.

In practice it may be difficult to satisfy the relation $C_o >> C_1$ relying on parasitic capacitances only. Therefore, a capacitor connected between the "OUT" line 35 and the local ground line can be added to increase the equivalent capacitance $C_o$. A practical embodiment is illustrated in FIG. 8a where also the comparator 45 incorporating an amplifier is shown.

Figure 8B:
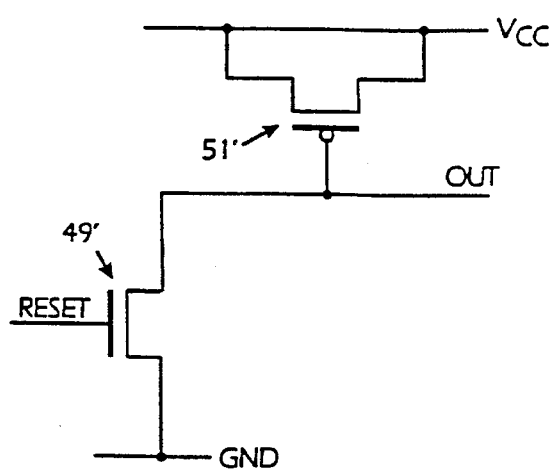
FIG. 8a illustrates a practical embodiment of a minimum value detector corresponding to FIG. 5a also depicting the comparator circuit and FIG. 8b illustrates a practical embodiment of a minimum value detector corresponding to FIG. 5b.
Figure 8A:
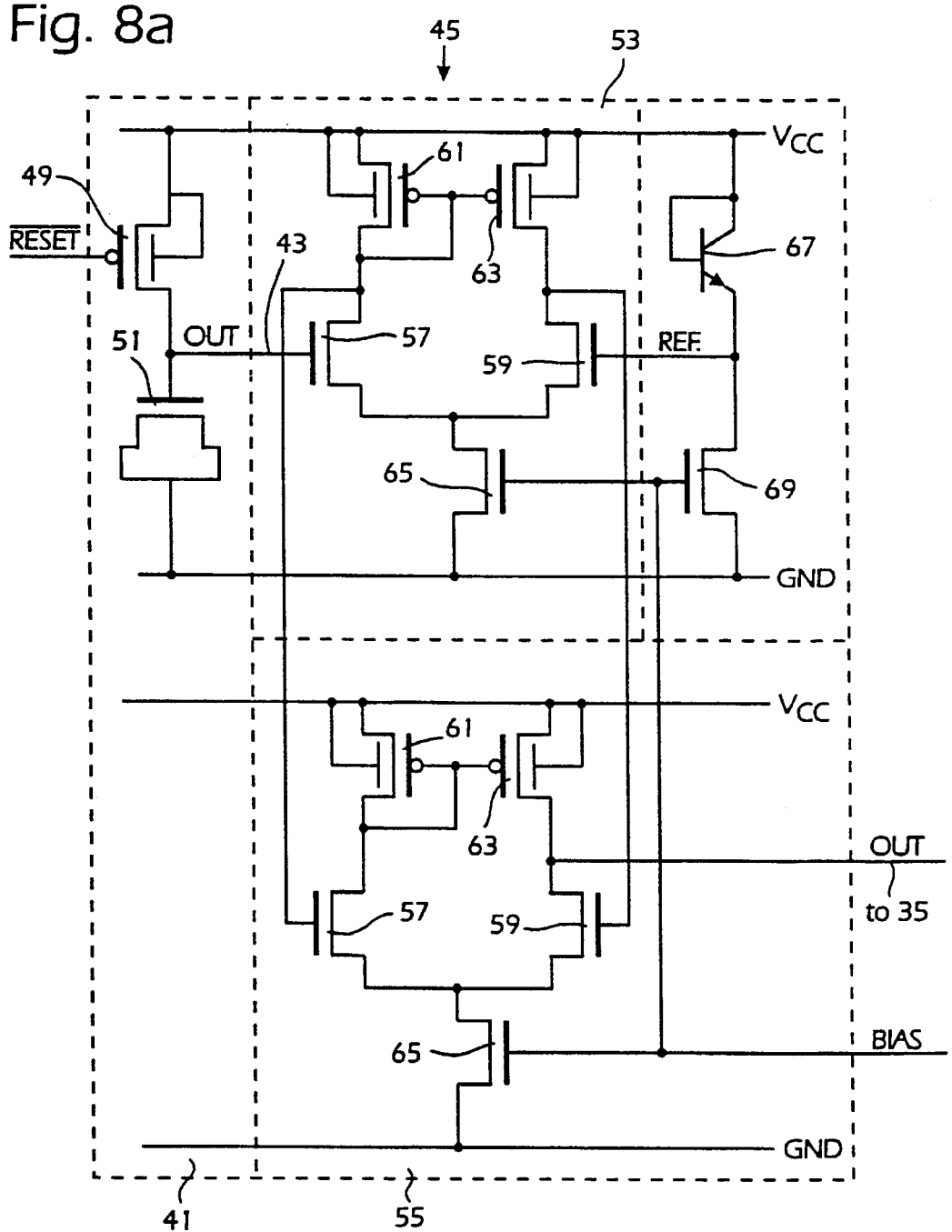

The detector of FIG. 8a thus includes, in addition to the transistor 49, a second PET transistor 51, connected as a capacitor having its source and drain connected to each other and to the ground line GND and its gate to the drain terminal of the first transistor 49.

The comparator 45 shown is a first differential amplifier 53 having a standard design and feeding a second similar amplifier 55 for obtaining a suitable output signal level, as required in conventional binary logic, on the line 35 to the boundary scan cell 36. Each differential amplifier stage 53, 55 has on each input side FET transistors 57, 59. The gate of the first transistor 57 in the first stage 53 receives the signal "OUT" from the minimum value detector step 41 and the gate of the second transistor 59 receives the reference signal "REF." From one first side of the transistors 57, 59 differential signals are output to the gates of the corresponding transistors 57, 59 in the second step 55. The signal to be delivered to the boundary scan cell 36 on the line 35 is output from one, first side of the second transistor pair 59 in the second stage 55.

The first side of each transistor pair 57, 59 is through a current mirror load network comprising FET transistors 61, 63 coupled to the local voltage supply line $V_{cc}$. The latter transistors 61, 63 thus have their source and substrate terminals coupled to $V_{cc}$ and their drains to the first side of the transistor pairs 57, 59. The gates of the p-channel transistors 61, 63 in each stage are connected to each other and are also connected to the first side of the first transistor pair 57 in each stage 53, 55, that is the side where the input signal "OUT" is output from the first stage 53 and the corresponding side in the second stage 55.

The second sides of the transistor pairs 57, 59 in each step are interconnected and are commonly also coupled to the local ground line GND through a bias FET transistor 65 controlled by a signal "BIAS".

The reference signal "REF." is in this embodiment obtained from the forward voltage drop of a p-n-junction, here in the shape of a bipolar non-transistor 67 having its base and collector interconnected and coupled to the local voltage supply line $V_{cc}$. The emitter of the transistor 67 in coupled to the local ground GND via a bias transistor PET 69 controlled by the "BIAS" signal on line 33". The emitter also produces the desired voltage reference signal "REF", delivered to the gate of the second transistor 59 in the first stage 53 of the comparator 45.

The comparator 45 can also, in its most simple form, be implemented as an inverter with a suitable triggering point. However, this is quite a conventional circuit solution and is not illustrated herein.

An enable signal, e.g., the ENABLE signal from the TAP controller 71 on line 33' (cf. FIG. 6a), can through a suitable circuit (not shown) be used for turning on (and off) the bias (signal "BIAS" in FIG. 8a) to minimize power consumption and support leakage tests.

Two transistors at most are needed in the minimum voltage detector as illustrated in FIGS. 6a and 8a. The decision point, when the detector signals a two low voltage, will however be somewhat dependent on the construction and processing of conductive paths inside the integrated circuit.

Figure 6B:
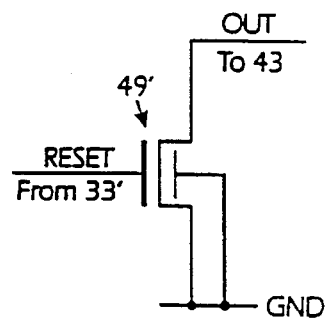
Figure 7B:
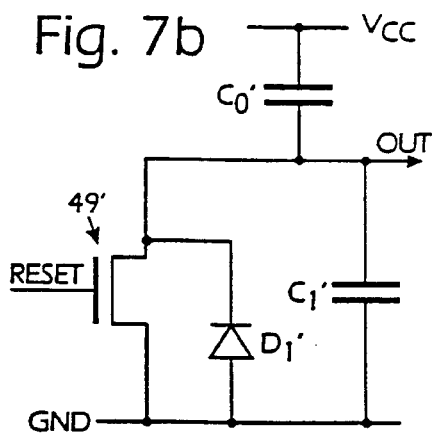

The complementary nature of the local voltages $V_{cc}$ and GND as depicted in FIG. 4 forms the basis of alternative embodiments of the simple circuits in FIGS. 6a and 8a. Thus, as is illustrated in FIG. 6b, the drain and substrate of the single FET transistor 49' are here connected to the local ground line GND. The help capacitance, see the circuit shown in FIG. 8b, in the shape of a p-channel FET transistor 51' connected for capacitor operation is connected with its gate to the source terminal of the first transistor 49', where the output signal "OUT" is generated on line 43, and the interconnected source and drain terminals of the FET 51' are coupled to the Supply Voltage line $V_{cc}$. The equivalent circuit, as depicted in FIG. 7b, illustrates the operation of the circuits in FIGS. 6b and 8b, the operation being basically identical to that of the circuits in FIGS. 6a and 8a. The charge on the equivalent capacitor $C_o$ is reduced during voltage drops and the remaining voltage thereover is sensed on the line "OUT".

An ordinary boundary scan cell 36 can be used as a means of reading the test result. It is described in the above-mentioned publication IEEE Standard B1149.1 IEEE Standard Test Access Port and Boundary-Scan Architecture.

A supply lead integrity check on a board with one or more devices equipped with supply voltage monitors is done in the following fashion.

1. Switching activity and power consumption of the device or devices (11) to be tested is set to a low level.

2. Using a fairly high supply voltage to the board (3), e.g., 5.5 V in a conventional 5 V system, the voltage monitor minimum value detectors are reset by activating the RESET signal (FIGS. 6a–8b).

3. The RESET signal is deactivated.

4. The board supply voltage is lowered to e.g., 5 V for a 5 V system and the device or devices (11) are activated by e.g., enabling the system clocks. During this time a voltage indicative of the minimum instantaneous supply voltage is stored on the capacitor $C_o$ (FIG. 7a, $C_o$, in FIG. 7b).

5. Circuit activity is stopped. The level of the supply voltage can again be adjusted setting the pass/fail threshold for indication by the voltage monitors. If the comparator (45) and/or the reference level generator (67) are provided with a lead for an enable signal (cf. 65, 69 in FIG. 8a) activated.

6. Test result is read from the output of the comparator (45).

During component testing the supply voltage monitors may be functionally checked with the supply voltage test by maintaining nominal voltage applied to the circuit in a first test and subsequently lowering the voltage to the circuit during a second test. A functionally correct monitor will then indicate a good supply voltage in the first test and a poor or insufficient supply voltage in the second test.

Sometimes, more than one voltage monitor on a chip will indicate a poor supply voltage, although only one lead/pin has an open solder joint. This typically occurs when pin/lead inductances are higher than the inductance/impedance of the on-chip voltage distribution metal between the two monitors indicating poor supply voltages.

Then, to isolate the faulty lead/pin, steps 5. and 6. above can be repeated, adjusting the reference voltage upward until only one monitor indicates a poor supply voltage. Repair should then be guided to the pins/leads monitored by this monitor.

If a decoupling capacitor 23, see FIG. 1, has not been properly attached to supply planes 19 and 21 in the component board 3, it will appear in a test pattern as described above as producing an insufficient voltage at several voltage monitors. From this effect such a faulty connection may be detected.

Normally, pins/leads are not available for directly controlling and observing the voltage monitors on a chip from the outside. Quite a few methods exist for minimizing the number of leads/pins required for test purposes. One such method, the IEEE 1149.1 boundary scan, has gained a substantial popularity over the last few years.

It has all the functionality required for controlling and observing the voltage monitors. For a circuit which already incorporates boundary scan, no extra pins/leads are required for introducing voltage monitors. Voltage monitors can be introduced in a boundary scan test architecture in several ways. This is standard practice to anyone having ordinary skills in the art. One such way is described below. For an explanation of the terms used, reference is made to the IEEE 1149.1 standard.

One scannable flip-flop (36') is connected to each voltage monitor comparator (31) output, with its parallel data input. The control signal RESET and if needed the signal ENABLE, are decoded from the TAP controlled (71) based on the TAP state, see below.

Steps 1. and 2. can be performed with the TAP controller in state UPDATE-DR. Steps 3. and 4. can be made with the TAP controller in state RUN-TEST/IDLE. Step 5 can be done in state SELECT-DC-SCAN. Step 6 can be performed in state CAPTURE-DR. Further propagation of test results from the scannable flip-flops (36, 36') to the TDO lead/pin is done with the TAP controller in state DR-SHIFT.

Although the present invention has been described by way of the foregoing exemplary embodiments, it is to be understood that those embodiments are intended to be illustrative in all respects rather than limitive of the present invention. Any and all modifications and variations of these exemplary embodiments within the spirit of the present invention are intended to be encompassed by the present invention, the scope of which is set forth in the appended claims.

I claim:

1. An electronic component comprising:

contact pins for supplying a supply voltage to the electronic component including a combination of at least two voltage carrying pins and at least one ground pin or a combination of at least two ground pins and at least one voltage carrying pin;

a local voltage carrying line and a local ground line inside the electronic component connected to at least one voltage carrying pin and to at least one ground pin, respectively;

a plurality of signal communication contact pins for communicating signals:

signal carrying leads inside the electronic component, each of said plurality of signal communication pins being connected to at least one signal carrying lead; and at least one device for locally monitoring the supply voltage, the device including at least one voltage monitor having an extreme value detector connected to one of the local voltage carrying line and the local ground line at a voltage monitoring position inside the electronic component.

2. An electronic component as claimed in claim 1, wherein the at least one device for locally monitoring the supply voltage is located adjacent to one of the at least one voltage carrying pin and the at least one ground pin.

3. An electronic component as claimed in claim 1, wherein there are an equal number of voltage carrying pins and ground pins.

4. An electronic component as recited in claim 1, wherein the contact pins are arranged in pairs, each pair including a voltage carrying pin and a ground pin, each voltage carrying pin located adjacent to a ground pin, and wherein there are at least two such pairs.

5. An electronic component as claimed in claim 4, wherein there is one device for locally monitoring the supply voltage located adjacent to at least every other pair.

6. An electronic component as claimed in claim 1, further comprising:

boundary scan means including a chain of interconnected shift cells for reading out a result of monitoring, each shift cell associated with one or more signal carrying leads inside the electronic component, wherein one of the shift cells is connected to receive an output signal from the at least one device for locally monitoring the supply voltage.

7. An electronic component as claimed in claim 1, where the electronic component is an integrated circuit.

8. An electronic component as claimed in claim 1, wherein the extreme value detector comprises means to sense an instantaneous minimum of an absolute voltage value.

9. An electronic component as claimed in claim 1, wherein the device for locally monitoring the supply voltage includes comparator means for comparing a voltage value sensed by the extreme value detector with a predetermined voltage value, and wherein the one of the shift cells which is connected to receive an output signal from the device for locally monitoring the supply voltage is also connected to an output line of the comparator.

10. An electronic component as claimed in claim 9, wherein the comparator means is a differential comparator.

11. An electronic component comprising:

contact pins for supplying a supply voltage including voltage carrying pins and ground pins;

local voltage carrying lines and local ground lines inside the electronic component connected to at least one voltage carrying pin and ground pin, respectively;

communication contact pins for communicating signals;

signal carrying leads inside the electronic component, each communication contact pin being connected to at least one signal carrying lead;

boundary scan means including a chain of interconnected shift cells, each shift cell associated with one or more signal carrying leads inside the electronic component, for reading out a monitoring result; and a device for locally monitoring the supply voltage including at least one voltage monitor, the voltage monitor including an extreme value detector connected to one of said local voltage carrying lines and local ground lines at a voltage monitoring position inside the electronic component, wherein one of said shift cells included in the chain of interconnected shift cells is connected to receive an output signal from the device for locally monitoring the supply voltage.

12. An electronic component as claimed in claim 11, wherein the device for locally monitoring the supply voltage is located adjacent to one of: the voltage carrying pins and the ground pins.

13. An electronic component as claimed in claim 11, wherein the voltage monitor included in the device for locally monitoring the supply voltage is connected to one of a local voltage supply and a ground lead, these being directly connected to a voltage supply pin or ground pin, respectively.

14. An electronic component as claimed in claim 11, wherein there are an equal number of voltage carrying pins and ground pins.

15. An electronic component as claimed in claim 11, where the electronic component is an integrated circuit.

16. An electronic component as claimed in claim 11, wherein the extreme value detector comprises means to sense an instantaneous minimum of an absolute voltage value.

17. An electronic component as claimed in claim 11, wherein the device for locally monitoring the supply voltage includes comparator means for comparing a voltage value sensed by the extreme value detector with a predetermined voltage value, and wherein the one of said shift cells which is connected to receive an output signal from the device for locally monitoring the supply voltage is also connected to an output line of the comparator means.

18. An electronic component as claimed in claim 11, wherein the comparator means is a differential comparator.

19. An electrical device comprising:

conductive paths and components electrically connected to the conductive paths, the conductive paths including paths for supplying a supply voltage including a voltage carrying path and a ground conductor path, the components including:

communication pins for communicating signals;

a combination of at least two voltage carrying pins and at least one ground pin, or a combination of at least two ground pins and at least one voltage carrying pin, the at least one voltage carrying pin and the at least one ground pin being in electrical contact with the same voltage carrying path and the ground conductor path;

a local voltage carrying line and a local ground line inside the device connected to at least one voltage carrying pin and ground pin, respectively;

signal carrying leads inside the device, each signal carrying lead being connected to at least one communication pin; and a device for locally monitoring the supply voltage including at least one voltage monitor, the voltage monitor including an extreme value detector connected to one of said local voltage carrying line and said local ground line at a voltage monitoring position inside the device.

20. An electrical device as claimed in claim 19, further comprising:

means for reading out a result of the monitoring, the reading out means including:

boundary scan means including a chain of interconnected shift cells, each shift cell associated with signal carrying leads inside the component, for reading out the monitoring result, and wherein one of said shift cells is connected to receive an output signal from the device for locally monitoring the supply voltage.

21. An electrical component board comprising:

conductive paths and components electrically connected to the conductive paths, the conductive paths including paths for supplying power including a voltage carrying path and a ground conductor path, the components including:

contact pins for receiving power supplied to each component including voltage carrying pins and ground pins, and communication pins for communicating signals, at least one component including;

local voltage carrying lines and local ground lines inside the at least one component connected to at least one adjacent voltage carrying pin and ground pin, respectively;

signal carrying leads inside the at least one component, each signal carrying lead being connected to at least one communication pin of the at least one component; and a device for locally monitoring the supply voltage including at least one voltage monitor, the at least one voltage monitor including an extreme value detector connected to one of said local voltage supply line and said local ground line at a voltage monitoring position inside the component board.

22. An electrical component board as claimed in claim 21, further comprising:

means for reading out a result of the monitoring, the reading out means including boundary scan means including a chain of interconnected shift cells, each shift cell associated with signal carrying leads inside the component board, for reading out the monitoring result, wherein one of said shift cells is connected to receive an output signal from the device for locally monitoring the supply voltage.

23. An electronic component as claimed in claim 4, wherein there is one device for locally monitoring the supply voltage located adjacent to every pin.

* * * * *